United States Patent [19]

Huang

[11] Patent Number: 5,448,522
[45] Date of Patent: Sep. 5, 1995

[54] MULTI-PORT MEMORY EMULATION USING TAG REGISTERS

[75] Inventor: Thomas B. Huang, San Jose, Calif.

[73] Assignee: Quickturn Design Systems, Inc., Mountain View, Calif.

[21] Appl. No.: 217,049

[22] Filed: Mar. 24, 1994

[51] Int. Cl.$^6$ ............................................. G11C 13/00
[52] U.S. Cl. .......................... 365/189.04; 365/189.01; 365/189.03; 365/189.05; 365/230.05
[58] Field of Search .................. 365/189.04, 189.01, 365/189.03, 189.05, 230.05

[56] References Cited

U.S. PATENT DOCUMENTS 5,148,397 9/1992 Kokubon .......................... 365/189.07

*Primary Examiner*—Terrell W. Fears
*Attorney, Agent, or Firm*—Lyon & Lyon

[57] ABSTRACT

A method of implementing a multi-port memory circuit in the memory resources of configuration logic blocks of programmable logic devices. The multi-port memory circuit to be implemented comprises a memory array having memory locations for storing data, read ports for reading data from the memory array and write ports for writing data to the memory array. Multiple duplications of the memory array are created in order to implement as many read ports and write ports as the multi-port memory circuit being implemented. The memory locations within the duplicate memory arrays are tagged to indicate which memory location had data written therein last so that only the last written data will be read through the various read ports.

5 Claims, 8 Drawing Sheets

MULTI-PORT MEMORY EMULATION USING TAG REGISTERS

BACKGROUND OF THE INVENTION

1. Field of the Invention

This invention relates generally to hardware emulation and more particularly concerns multi-port memory emulation.

2. Description of the Prior

Various tools are used when designing integrated circuits. One such tool is a hardware emulation system. Examples of such emulation systems are described in U.S. Pat. Nos. 5,109,353 to Sample et al and 5,036,473 to Butts et al, both of which are incorporated by reference.

When designing integrated circuits, a netlist description of the integrated circuit is generated. The netlist is a description of the integrated circuit's components and electrical interconnections. It can be used to create all necessary masks for actual fabrication of the integrated circuit.

As described in the Sample et al and Butts et al patents, emulation technology can be used to ensure that the integrated circuit under design actually works in the system in which it will be installed. Reconfigurable emulation systems typically are comprised of multiple interconnected reconfigurable logic devices such as field programmable gate arrays (FPGAs). Reconfigurable logic devices are ideal for the emulation of the logic circuits of a given integrated circuit design. However, modern integrated circuits such as microprocessors also incorporate memory circuits which can be difficult to emulate properly. Furthermore, the memory circuits are often multi-port in design, which is even more difficult to emulate properly.

Typical memory circuits are arranged such that they have a plurality of memory locations. Each memory location can store a certain number of bits. Memory circuits are typically classified lo by the number of memory locations they have (often referred to as the "depth" of the memory circuit) and the number of bits that can be stored in each location (often referred to as the "width" of the memory circuit). Therefore, a memory circuit having thirty-two locations with each location containing eight bits would be called a "thirty-two by eight" memory circuit. When the memory circuit has multiple ports, the memory circuit is further defined by the number of write ports and the number of read ports.

In a conventional multi-port memory, data can be written to memory locations through different ports. Each write port can access each memory location and each write port can write at the same time. However, it is not possible for different ports to write data to the same memory location at the same time. Likewise, each read port can access each memory location and each read port can read data at the same time. However, unlike the write ports, different read ports can read data from the same address at the same time.

Newer generations of reconfigurable logic devices have the ability to configure memory circuits within their configurable logic blocks, or CLBs. One such reconfigurable logic device is the XC4000 family from Xilinx, Inc., San Jose, Calif. In the XC4000 family, each CLB can implement a sixteen by two or a thirty-two by one static random access memory (RAM). However, there is no multi-port memory capability.

An example of a method for implementing multi-port memory circuits in an emulation system is described in pending U.S. patent application Ser. No. 08/067,571 entitled Multi-Port Memory Emulation. This co-pending application is hereby incorporated by reference. This method converts the netlist's transistor level definitions of memory into logical definitions in order to implement the memory within a Xilinx FPGA.

This method, however, requires a large amount of the CLB capacity of the emulation system. Therefore, it would be desirable to have a method for emulating multi-port memory circuits that does not require a large number of CLBs.

SUMMARY OF THE INVENTION

The present invention overcomes the problems and disadvantages of the prior art through a unique method of duplicating the memory array of multi-port memory circuit being emulated and tagging the memory locations within the duplicate memory arrays which had data written therein after the same memory location within a different duplication of the memory array had data written therein.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

FIG. 4b is a block diagram of a portion of the tag registers used when emulating the multi-port random access memory circuit shown in FIG. 4a.

FIG. 4c is a block diagram of portion of the tag registers used when emulating the multi-port random access memory circuit shown in FIG. 4a.

FIG. 4d is a block diagram of portion of the tag registers used when emulating the multi-port random access memory circuit shown in FIG. 4a.

DETAILED DESCRIPTION OF THE DRAWINGS

Turning to the figures, the presently preferred method of the present invention will now be described.

Figure 1:
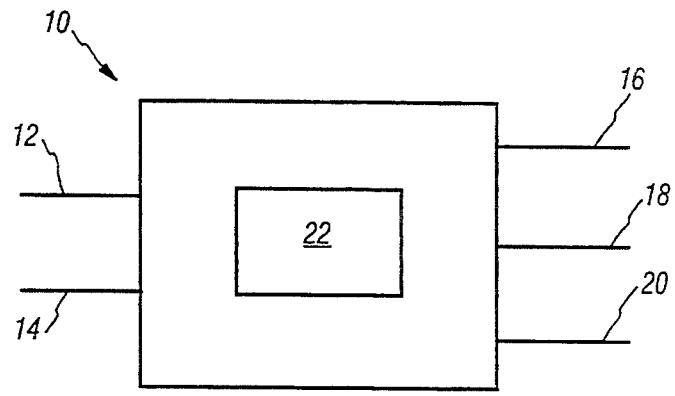
FIG. 1 is a block diagram of a multi-port random access memory circuit.

FIG. 1 discloses a prior art multi-port memory circuit 10. The circuit 10 of FIG. 1 includes two write ports 12 and 14 and three read ports 16, 18 and 20. Write ports 12 and 14 can write to any memory location in memory array 22 of the memory circuit 10 and read ports 16, 18 and 20 can read from any memory location in the memory array 22 of the memory circuit 10. The number of write ports and the number of read ports in FIG. 1 is exemplary only. It is possible for a multi-port memory circuit to have fewer write and read ports than shown or more write ports and read ports than shown.

Figure 2:
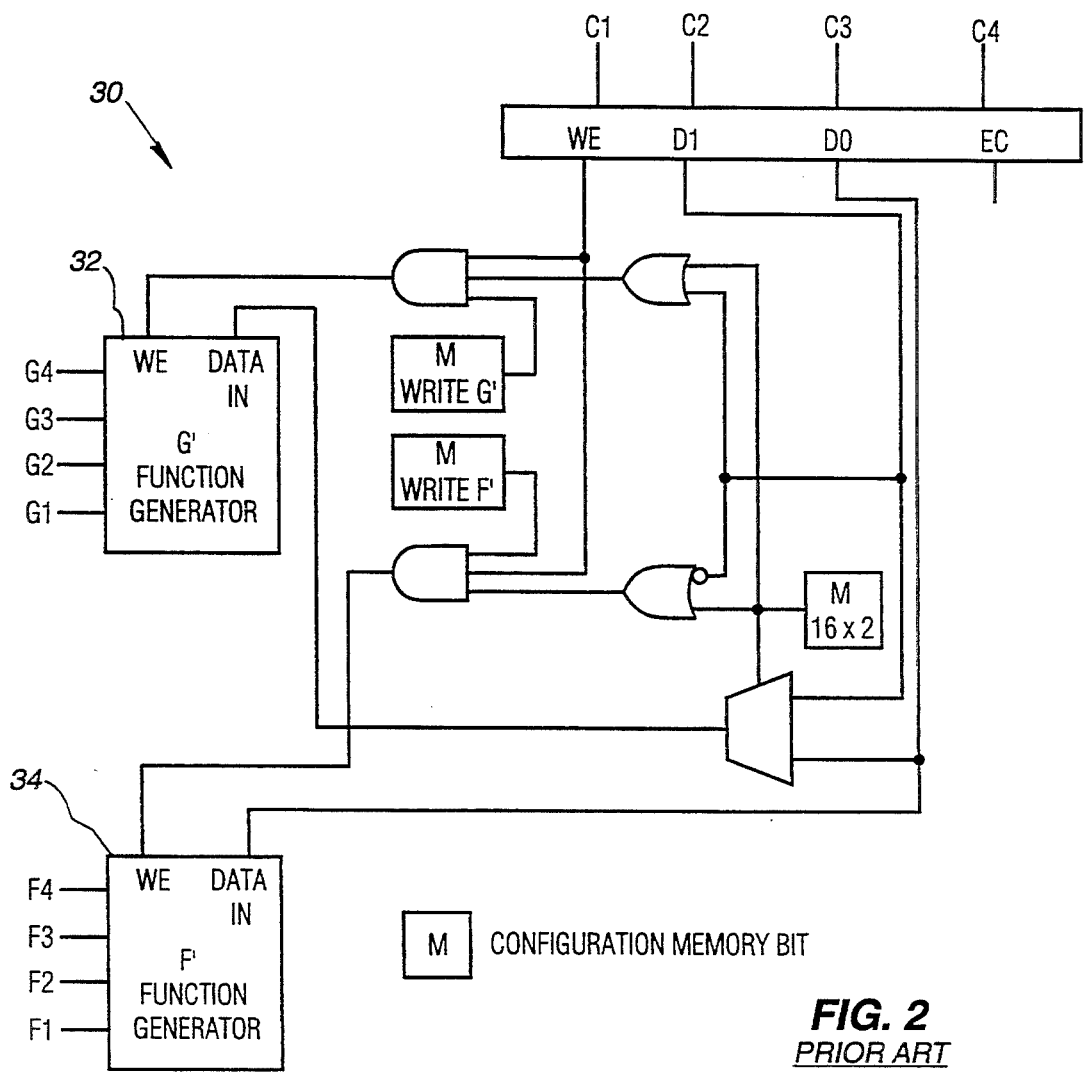
FIG. 2 is schematic diagram of a configuration logic block of a Xilinx type field programmable gate array.

FIG. 2 shows a schematic diagram of one CLB 30 of an XC4000 family reconfigurable logic device. CLB 30 is comprised of function generators 32 and 34. These function generators 32 and 34 contain look-up tables that are used when implementing logic functions. When memory circuits are implemented in the CLBs 30, the look-up tables within them function as static RAM. However, when the function generators in each CLB 30 are functioning as RAM, they are not capable of multi-port memory circuits.

In order to implement multi-port memory circuits in an emulation system, the CLBs are utilized as single-port memory circuits. However, the single-port memory circuits are utilized so that they emulate a multiple port memory circuit.

Figure 3:
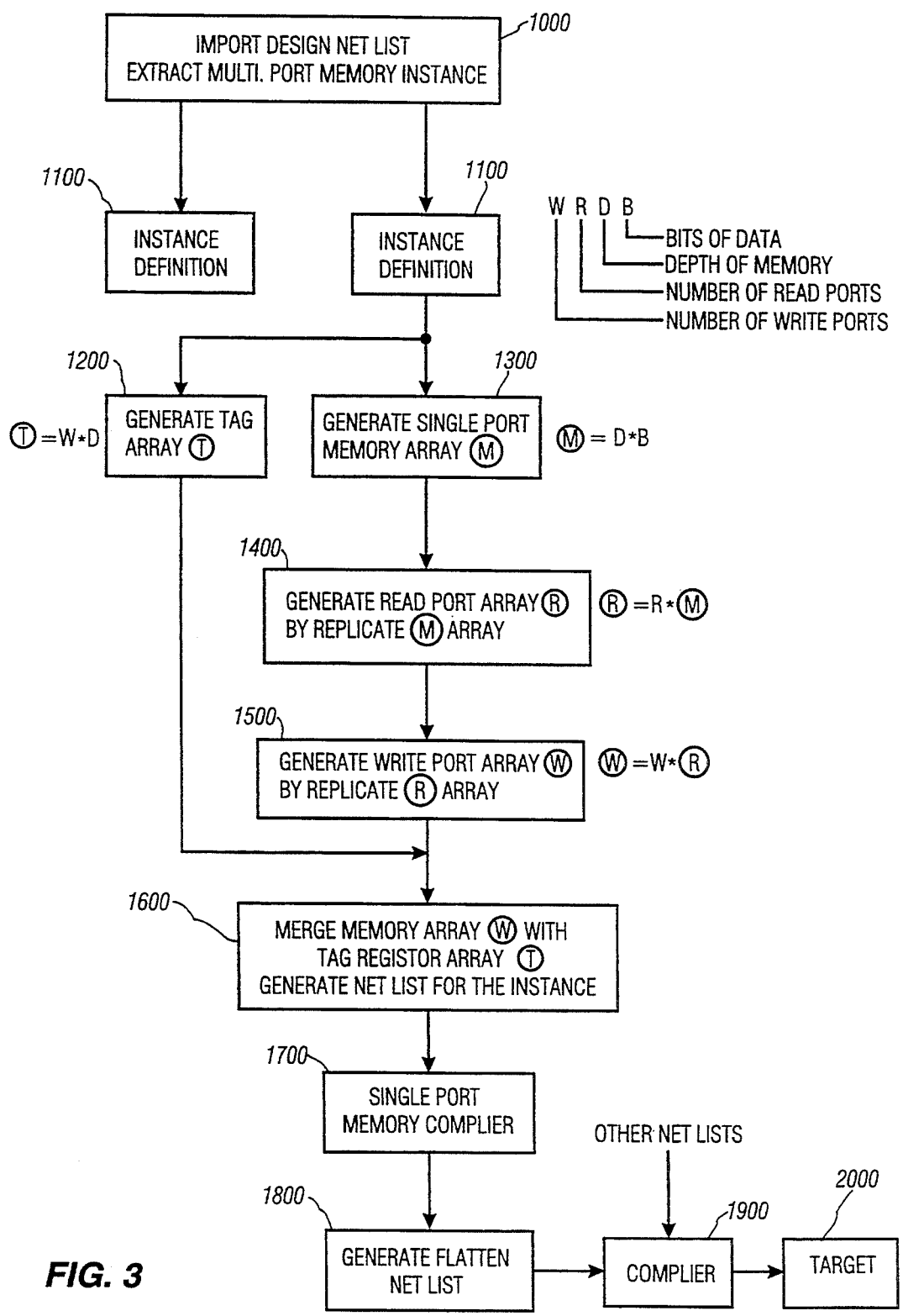
FIG. 3 is a flow chart of an embodiment of the present invention used to emulate multi-port memory circuits.

A flow chart of an embodiment of the present invention is shown in FIG. 3. FIG. 3 shows that a step 1000 in an embodiment of the present invention is to import the netlist description of the design to be emulated. At step 1100, the system determines that a memory instance occurs within a netlist that must be defined. This is because the memory circuits to be emulated are generally defined with transistors, which typically cannot be handled by emulation systems. The instance definition shown in FIG. 3 is for a multiport memory circuit. Multiple instance definitions may occur for each netlist being emulated. After instance definition 1100, the array 22 of multi-port memory circuit is generated at step 1300. In addition to generation 1300 of the array 22, the TAG array is generated at step 1200. As will be discussed, the TAG array comprises a plurality of tag registers and logic associated with those registers. The number of tag registers is determined by the number of write ports of the multi-port memory circuit being emulated multiplied by the depth of the memory circuit being emulated. After the memory array 22 is generated at step 1300, read-port memory arrays are generated at step 1400. Then, at step 1500, the write-port memory arrays are created at step 1500. There is a write-port memory array for each write port of the multi-port memory circuit being emulated. Each write port is comprised of the read-port memory arrays generated at step 1400.

After the write-port memory arrays are created at step 1500, they are merged with the TAG array and the netlist for the memory instance defined at step 1100 is generated at step 1600. At step 1700, single port memory compile takes place. This step 1700 can use the memory compile software provided by a programmable logic circuit vendor such as Xilinx. At step 1800, the flattened memory netlist is generated. At step 1900, other netlists are compiled. Finally, at step 2000, the multi-port memory circuit can be emulated in the emulated circuit's target system.

In the present invention, the memory array 22 of the multi-port memory circuit to emulated is first duplicated. The number of times the memory array 22 is duplicated is determined by how many read ports the multi-port memory circuit to be emulated has. For every read port that the multi-port memory circuit to be emulated has, there will be a read-port memory array created. Each read-port memory array is comprised of a copy of the memory array 22 and therefore includes each of the memory locations of the memory array 22. Read-port memory arrays are created by duplicating those portions of the netlist that describe the memory array 22.

After the read-port memory arrays are created, write-port memory arrays are created. Write-port memory arrays are created for each write port of the multi-port memory circuit being emulated. The write-port memory arrays comprise a copy of each read-port memory array that was duplicated for each read port. Therefore, each write-port memory array contains a read-port memory array for each read port of the multi-port memory circuit being emulated.

Figure 4A:
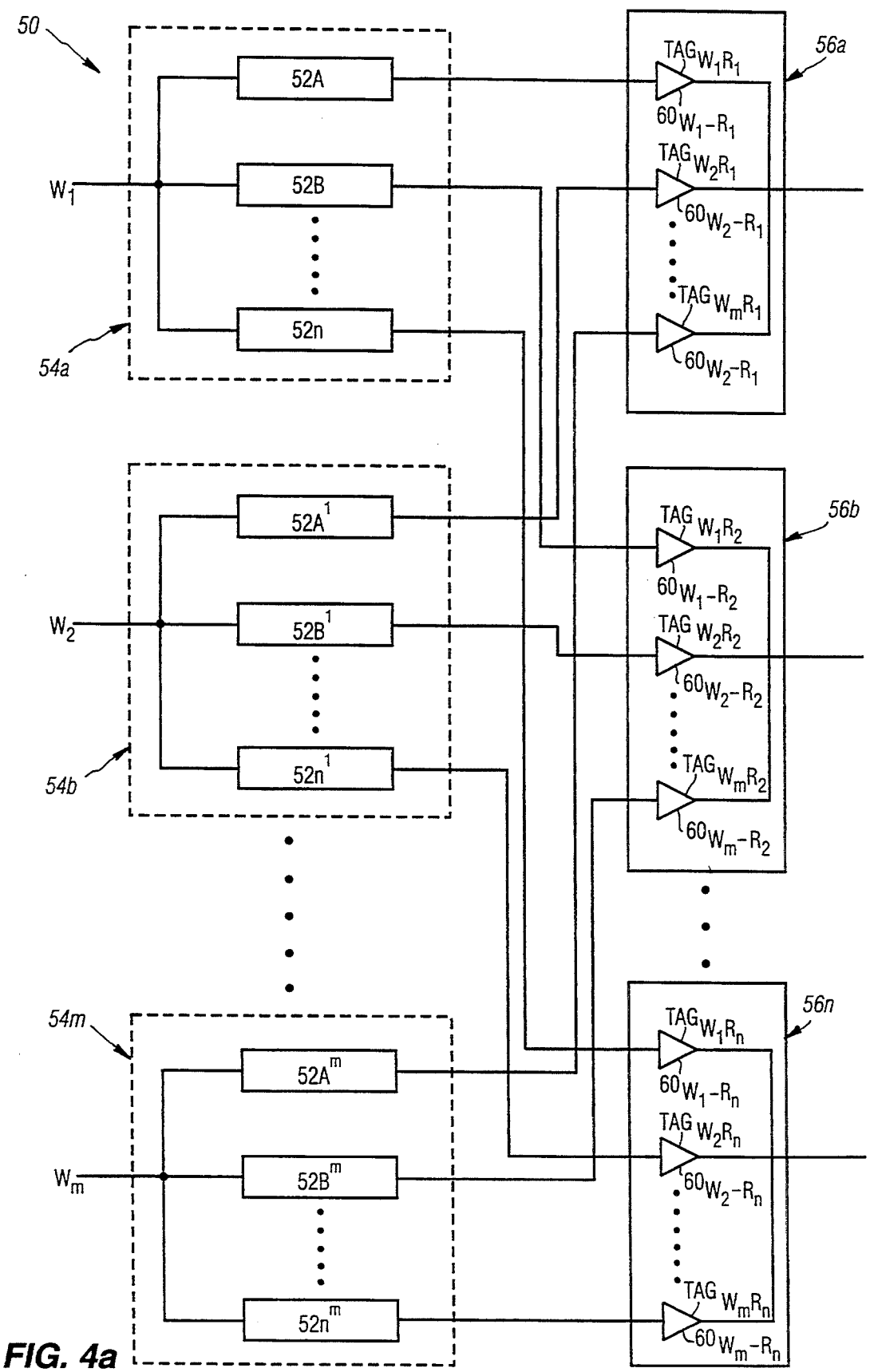
FIG. 4a is a block diagram of a multi-port random access memory circuit implemented in write-port memory arrays and read-port memory arrays according to the present invention.

A block diagram of this is shown in FIG. 4a. FIG. 4a shows a multi-port memory 50 with n read ports and m write ports. Duplicate read-port memory arrays 52a, 52b . . . 52n of the actual memory array 22 of the multi-port memory circuit being emulated are created for each read port. Then, each read-port memory array 52a, 52b . . . 52n is duplicated for each write port, thereby creating write-port memory arrays 54a, 54b . . . 54m. In particular, write-port memory array 54a is comprised of read-port memory arrays 52a, 52b . . . 52n. Write-port memory array 54b is comprised of read-port memory arrays $52a^1, 52b^1 \ldots 52n^1$. Write-port memory array 54m is comprised of read-port memory arrays $52a^m, 52b^m \ldots 52n^m$. This architecture allows data to be written from multiple write ports and read from multiple read ports, as will be discussed below.

When data is written to a memory location in a multi-port memory circuit like that shown in FIG. 1, that data to be written replaces the data in that location. In the multi-port memory circuit of the present invention, however, it is not possible to replace the data in that memory location because that memory location has been duplicated in numerous read-port memory arrays. If the data to be written to a particular memory location were replaced everywhere that location was duplicated, the system would be too slow to be practicable. Therefore, when data is to be written to a memory location through a particular write port, it is written to that memory location in each of the duplicate read-port memory arrays comprising the write-port memory array associated with the actual write port performing the write. The data, however, is not written to the other read-port memory arrays comprising the write-port memory arrays not performing the write.

This arrangement allows for complete emulation of multi-port memory circuits within programmable logic circuits that provide for only single-port memory circuits. However, because data is written only to those read-port memory arrays $52a^m, 52b^m \ldots 52n^m$ located within the write-port memory array 54m that wrote the data, it is possible that a particular memory location within one of the read-port memory arrays $52n^m$ in a particular write-port memory array 54m will be different than the data at the same memory location in a duplicate read-port memory array, for example $52a^1$, which is part of a different write-port memory array, for example $54b$. Therefore, it is critical that the system architecture be such that the read ports $56a$, $56b$ ... $56n$ read the data for a particular memory location that was written most recently.

Read port one $56a$ has inputs from the first read-port memory arrays $52a$, $52a^1$ ... $52a^m$ within each of the write-port memory arrays $54a$, $54b$ ... $54m$. Each of the inputs from the read-port memory arrays $52a$, $52a^1$ ... $52a^m$ is connected to a driver $60_{Wm-Rn}$. Read port two $56b$ has inputs from the second read-port memory arrays $52b$, $52b^1$ ... $52b^m$ within each of the write-port memory arrays $54a$, $54b$ ... $54m$. Read port n $56n$ has inputs from the n read-port memory arrays $52n$, $52n^1$ ... $52n^m$ within each of the write-port memory arrays $54a$, $54b$ ... $54m$.

Figure 5:
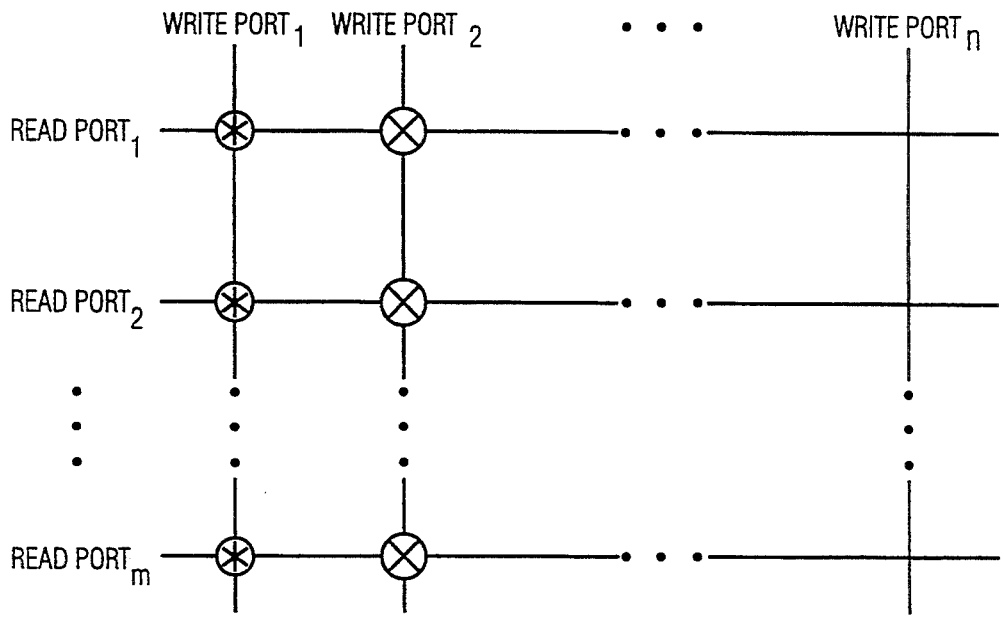
FIG. 5 is a diagram showing why it is important to track the last written data for a particular memory location.

With reference to FIG. 5, an example of why it is critical that the read ports read the last written data for a particular memory location will be shown. If data for a particular memory location is written through write port one, it will be written in that memory location in each read-port memory array for that particular write-port memory array, which in this example is represented by a *. Then, if data is written to that same location through write port two, it will be written only in that memory location in each read-port memory array for that particular write-port memory array, which in this example is represented by an X. Thus, the same memory location in each write-port memory array has different data stored therein. In order for the emulation of the multi-port memory circuit to be accurate, the last data written to that memory location must be read by the selected read port while the older data must be ignored.

In order ensure that the selected read port reads data from the memory location within the proper read-port memory array, a series of tag registers are used. Tag registers are used to ensure that only the last written data for a particular memory location will be read from the emulated memory circuit. The number of tag registers that are necessary is determined by the depth and the number of write ports of the multi-port memory circuit to be emulated.

Figure 4B:
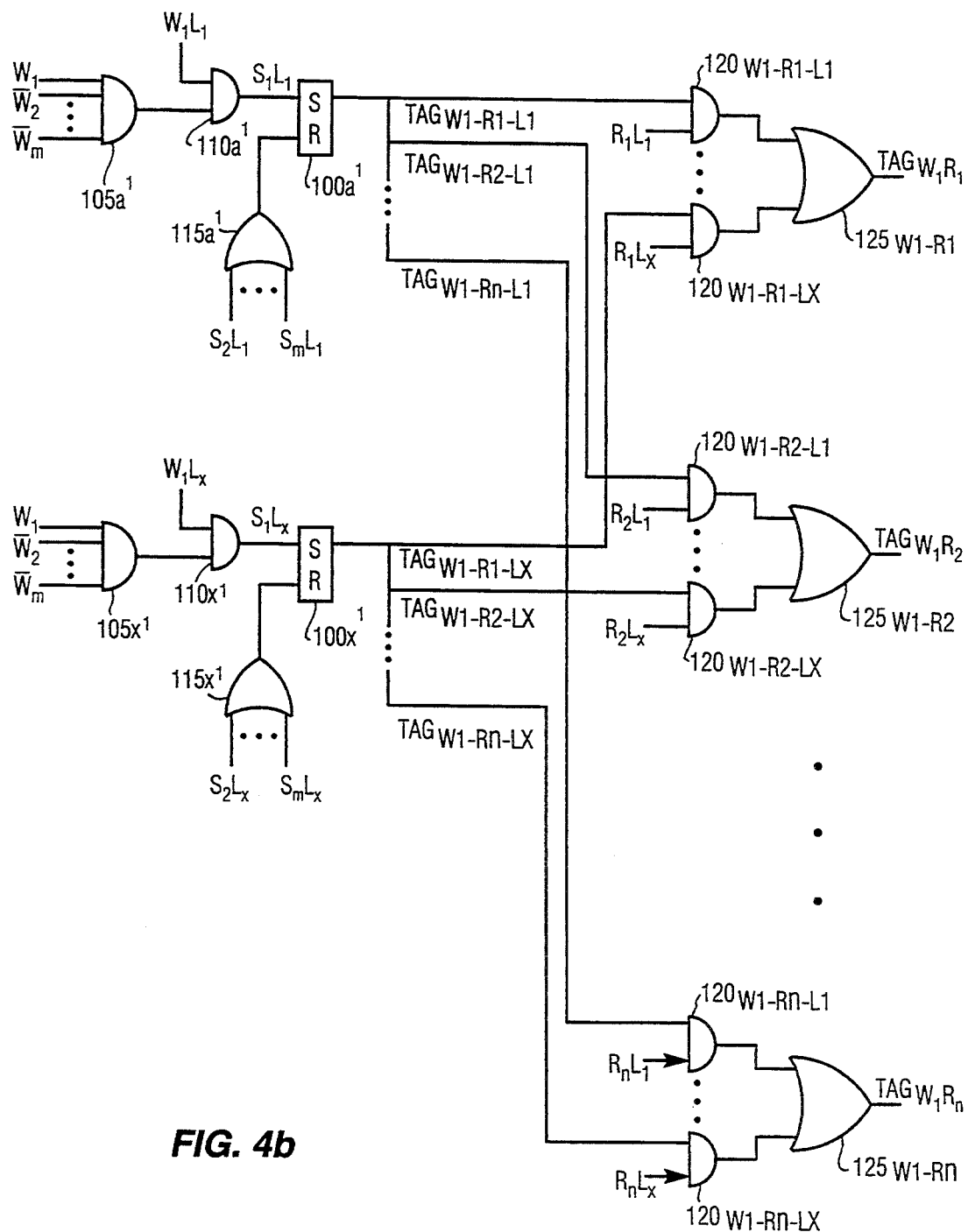
Figure 4C:
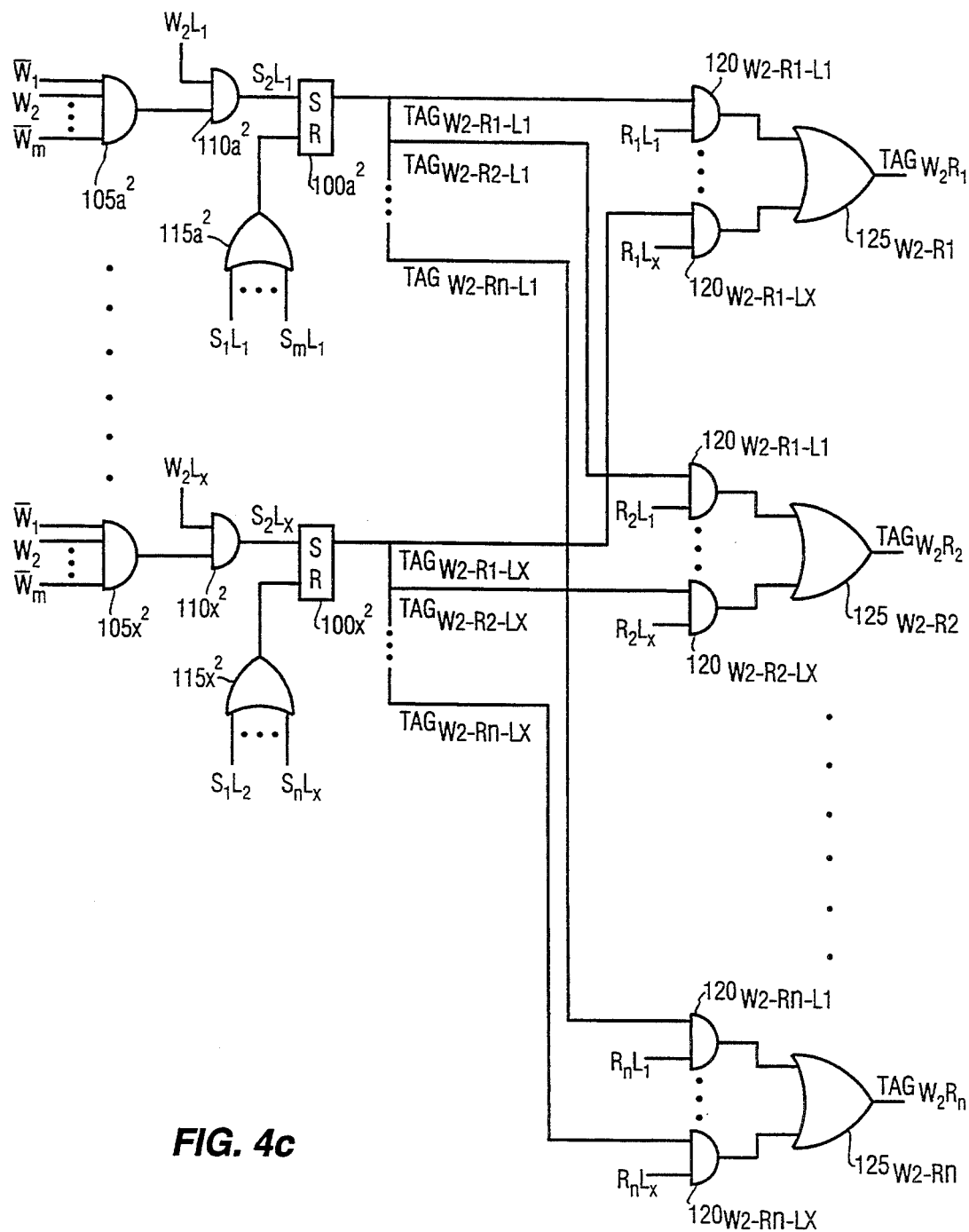
Figure 4D:
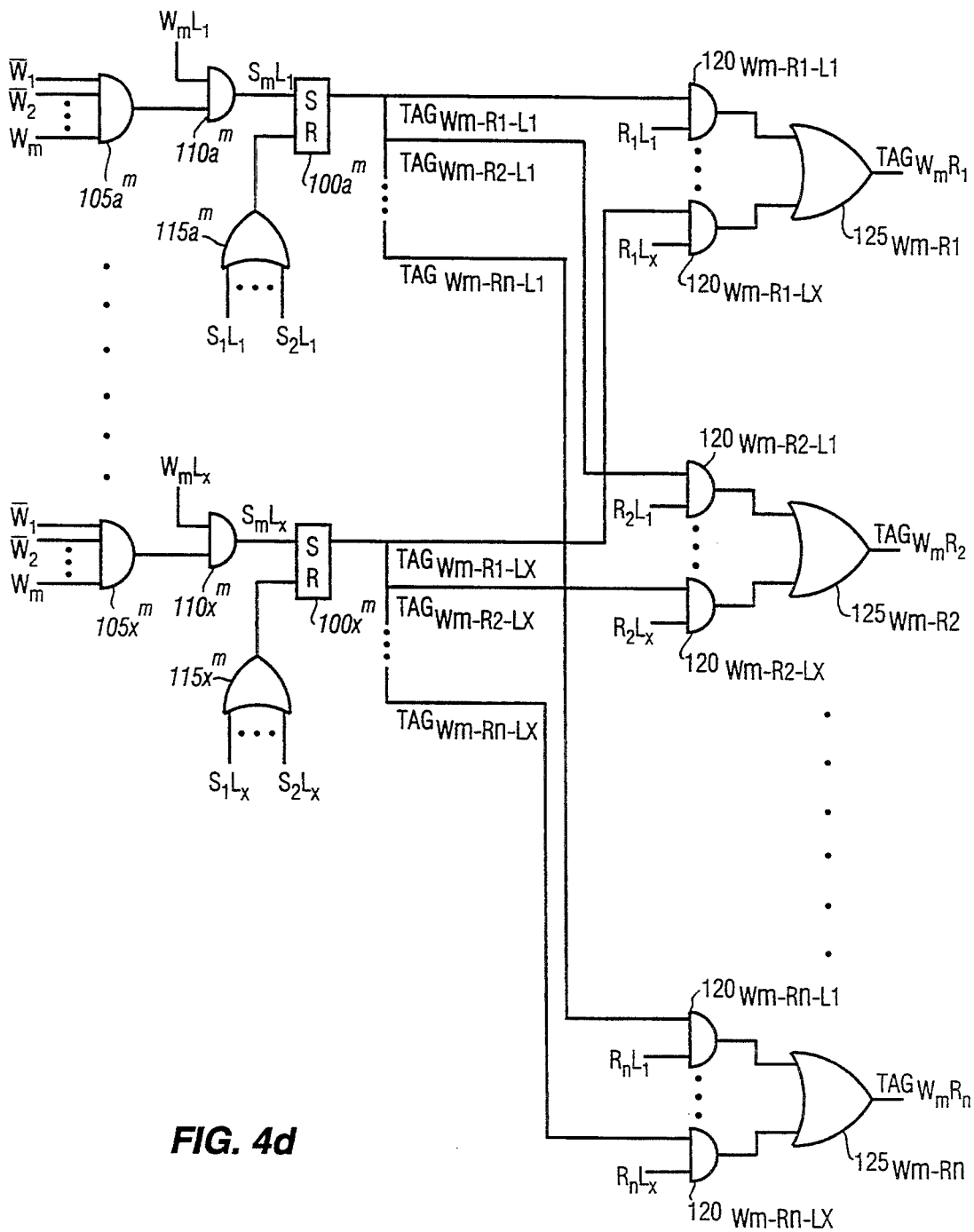

The architecture of the tag registers will be described with reference to FIGS. 4a–4d. As discussed, the number of tag registers is determined by multiplying the number of write ports by the number of memory locations. In the multi-port memory shown in FIG. 4a, there are m write ports and x memory locations. Therefore, there will be m*x tag registers. FIGS. 4b–4d show the architecture of the tag registers. Tag registers are arranged so that the particular tag registers associated with a particular write-port memory array are grouped together. As will be shown, each tag register can be a SET-RESET type flip flop.

FIG. 4b shows the tag registers associated with write-port memory array $54a$. FIG. 4c shows the tag registers associated with write-port memory array $54b$. FIG. 4d shows the tag registers associated with write-port memory array $54m$. There will be one tag register for each memory location within a write-port memory array. Thus, in FIG. 4b, tag register $100a^1$ is used to tag the data written into memory location one within write-port memory array one $54a$ if it is the last written data to that location. Since a tag register is created for each memory location within the write-port memory array, any number of tag registers may be created, culminating in tag register $100x^1$. Referring to FIGS. 4b–4d, tag registers $100a^1$, $100a^2$ and $100a^m$ ensure that the last written data to memory location one is read through each read port. Tag registers $100x^1$, $100x^2$ and $100x^m$ ensure that the last written data to memory location x is read through each read port.

The input logic to each tag register $100a^1$ ... $100x^1$, $100a^2$ ... $100x^2$, and $100a^m$ ... $100x^m$ is as follows. An output from a first AND gate $105a^1$ ... $105x^1$, $105a^2$ ... $105x^2$, and $105a^m$ ... $105x^m$ having inputs for each write enable, write enable one ($W_1$), write enable two ($W_2$) ... write enable m ($W_m$), is input to a second AND gate $110a^1$ ... $110x^1$, $110a^2$ ... $110x^2$, and $110a^m$ ... $110x^m$ respectively. The first AND gates $105a^1$ ... $105x^1$ associated with the tag registers $100a^1$ ... $100x^1$ for the first ... x'th memory locations within the first write-port memory array have their $W_1$ input set as a "true" while the $W_2$ ... $W_m$ inputs are set as "false". The second AND gates $105a^2$ ... $105x^2$ associated with the tag registers $100a^2$ ... $100x^2$ for the first ... x'th memory locations within the second write-port memory array have their $W_2$ input set as a "true" while the $W_1$ ... $W_m$ inputs are set as "false". Finally, the m'th AND gates $105a^m$ ... $105x^m$ associated with the tag registers $100a^m$ ... $100x^m$ for the first ... x'th memory locations within the m'th write-port memory array have their $W_m$ input set as a "true" while the $W_1$ ... $W_2$ inputs are set as "false".

The second input to the second AND gate $110a^1$ ... $110x^1$, $110a^2$ ... $110x^2$, and $110a^m$ ... $110x^m$ is the write enable for the particular location within that write-port memory array, for example $W_1L_1$, which is the write enable for the first memory location. The output of the second AND gate $110a^1$ ... $110x^1$, $110a^2$ ... $110x^2$, and $110a^m$ ... $110x^m$ is the SET for that particular memory location, which will be labeled with the convention $S_mL_x$ where m is the particular write port and x is the particular memory location. This $S_mL_x$ signal is input to the SET input of the tag registers $100a^1$ ... $100x^1$, $100a^2$ ... $100x^2$, and $100a^m$ ... $100x^m$.

The output of a first OR gate $115a^1$ ... $115x^1$, $115a^2$ ... $115x^2$, and $115a^m$ ... $115x^m$ respectively is input the RESET input of the tag registers $100a^1$ ... $100x^1$, $100a^2$ ... $100x^2$, and $100a^m$ ... $100x^m$ respectively. The inputs to the first OR gate $115a^1$ ... $115x^1$, $115a^2$ ... $115x^2$, and $115a^m$ ... $115x^m$ are the SET $S_mL_x$ signals input to the tag registers associated with the same memory location for the other ports.

The output of each tag register $100a^1$ ... $100x^1$, $100a^2$ ... $100x^2$, and $100a^m$ ... $100x^m$ is associated with a write port, a read port and a memory location and indicates whether a particular memory location of a read-port memory array within a write-port memory has the last written data for a particular memory location written therein. Therefore, the tag registers form a three-dimensional array, a write port dimension, a read port dimension and a memory location dimension. The convention to be used in this application for the outputs of the tag registers is $TAG_{Wm-Rn-Lx}$. Since the data written through a particular write port is written to the same memory location within each read-port memory array of that write-port memory array, the output of each tag register will be split so that a $TAG_{Wm-Rn-Lx}$ is created for each read-port memory array. For example, in FIG. 4b, the output of tag register $100a^1$ creates $TAG_{W1-R1-L1}$, $TAG_{W1-Rn-L1}$ ... $TAG_{W1-Rn-L1}$.

The outputs of the tag registers $100a^1$ ... $100x^1$, $100a^2$ ... $100x^2$, and $100a^m$ ... $100x^m$, $TAG_{Wm-Rn-Lx}$, are connected to an input of a third AND gate $120_{Wm-Rn-Lx}$. The other input to the third AND gate $120_{Wm-Rn-Lx}$ is the read enable for that memory location associated with the $TAG_{Wm-Rn-Lx}$. For example, outputs from tag register $100a^1$ which are denoted as $TAG_{W1-R1-L1}$, $TAG_{W2-R2-L1}$ ... $TAG_{W1-Rn-L1}$ because they will tag the first memory location within the first, second ... n read-port memory arrays within the first write-port memory array 54a, are input to the third AND gates $120_{W1-R1-L1}$, $120_{W1-R2-L1}$ ... $120_{W1-Rn-L1}$ respectively. The read enables for the first memory location $R_1L_1, R_2L_1 ... R_nL_1$ are the other inputs to the third AND gates $120_{W1-R1-L1}$, $120_{W1-R2-L1}$ ... $120_{W1-Rn-L1}$ respectively.

The third AND gates $120_{Wm-Rn-Lx}$ are arranged such that those associated with a particular read-port memory array of a particular write-port memory array have their outputs sent a specific second OR gate $125_{Wm-Rn}$. For example, the output of third AND gate $120_{W1-R1-L1}$ is an input to second OR gate $125_{W1-R1}$. In addition, the output of third AND gate $120_{W1-R1-Lx}$ is an input to the same second OR gate $125_{W1-R1}$.

The outputs of the various second OR gates $125_{Wm-Rn}$ create a final tag signal, $Tag_{Wm-Rn}$, that is indicative of whether the read-port memory array for that particular write-port memory has the last written data for a memory location. Those outputs, $Tag_{Wm-Rn}$, of second OR gates $125_{Wm-Rn}$ are input to the various drivers $60_{Wm-Rn}$ of the read ports 56a, 56b ... 56n and either enable that driver if the read-port memory array it is connected to has the last written data for a particular memory location or disables that driver is the read-port memory array for that particular location does not have the last written data for a particular location.

The tag registers $100a^1 ... 100x^1, 100a^2 ... 100x^2$, and $100a^m ... 100x^m$ ensure that only the last written data for a particular memory location is read from the selected read port. For example, if a write enable occurs at write port one 54a ($W_1$) to write a logical "one" at memory location one ($L_1$), the emulation system of the present invention would write a logical "one" in each $L_1$ located in each read-port memory array 52a, 52b ... 52n. During the time the write operation is occurring, the read outputs are latched by a latch (see the example of FIGS. 6a-6b) to ensure that the read data is not written through in the case where a read enable and a write enable occur at the same time.

At the same time the data is being written to the read-port memory arrays 52a, 52b ... 52n, the write enable signal is sent to the tag registers for the particular memory location. This write enable signal $W_1$ will be input through each of the first AND gates $105a^1 ... 105x^1, 105a^2 ... 105x^2$, and $105a^m ... 105X^m$. Since $W_1$ will be "true" and $W_2$ and $W_3$ will be inverted from "false" to "true", the output of the first AND gates $105a^1 ... 105x^1$ associated with the first write-port memory array 54a will be a "true" (note that the $W_1$ signal will also be input to all the other first AND gates $105a^2 ... 105x^2, 105a^m ... 105x^m$, but since the "true" $W_1$ signal will be input as a "false" to those AND gates $105a^2 ... 105x^2, 105a^m ... 105x^m$, the output of those other AND gates $105a^2 ... 105x^2, 105a^m ... 105x^m$ will have to be "false"). Since $W_1L_1$ will be "true" while $W_1L_x$ will be "false" (a write enable only occurred for $L_1$), only the output of the second AND gate $110a^1$ associated with the first memory location will be "true". Thus, the $S_1L_1$ signal will be "true" which will present a "true" to the "set" input on tag register $100a^1$.

At the same time, since $S_2L_1$ and $S_mL_1$ signals will be "false" the first OR gate $115a^1$ will present a "false" to the RESET input on tag register $100a^1$.

Thus, the $TAG_{W1-R1-L1}$, $TAG_{W1-R2-L1}$ ... $TAG_{W1-Rn-L1}$ inputs respectively to third AND gates $120_{W1-R1-L1}$, $120_{W1-R2-L1}$ ... $120_{W1-Rn-L1}$ respectively will be "true". When and if a read enable for memory location one ($R_1L_1, R_2L_1 ... R_nL_1$) occurs, it will also be input to the third AND gates $120_{W1-R1-L1}$, $120_{W1-R2-L1}$ ... $120_{W1-Rn-L1}$, which will then present a "true" to the second OR gates $125_{W1-R1}$, $125_{W1-R2}$ ... $125_{W1-Rn}$, which will create a "true" output. These outputs, designated as $Tag_{W1R1}$, $Tag_{W1W2}$ ... $Tag_{W1Rn}$ will be input to drivers $60_{W1-R1}$, $60_{W1-R2}$ ... $60_{W1-Rn}$ to output the logical "one" from the memory location one within the first write-port memory array.

Now, if after the data was written to memory location one ($L_1$) through write port one 54a, new data, for example a logical "zero" is written to memory location one ($L_1$) through write port two 54b, the following will occur to ensure that only the last written data for $L_1$, a "zero" is read not the data previously written at write port one 54a, a "one".

When the write enable signal occurs at write port two 54b ($W_2$) to write a logical "zero" the emulation system of the present invention will write a logical "zero" in each memory location one $L_1$ located in the read-port memory arrays $52a^1, 52b^1 ... 52n^1$. During the time the write operation is occurring, the read outputs are latched by a latch (see the example of FIGS. 6a-6b) to ensure that the read data is not written through in the case where a read enable and a write enable occur at the same time.

At the same time the data is being written to the read-port memory arrays $52a^1, 52b^1 ... 52n^1$, the write enable signal $W_2$ is sent to the tag register logic. This write enable signal $W_2$ will be input to the first AND gates $105a^1 ... 105x^1, 105a^2 ... 105x^2$, and $105a^m ... 105x^m$. Since $W_2$ will be "true" and $W_1$ and $W_3$ will be inverted from "false" to "true", the output of the first AND gates $105a^2 ... 105x^2$ associated with the second write-port memory array 54b will be a "true" (note that the "true" $W_2$ signal will also be input to all the other first AND gates $105a^1 ... 105x^1$, and $105a^m ... 105x^m$, but since the inverse of $W_2$ will be input to those other first AND gates $105a^1 ... 105x^1$, and $105a^m ... 105x^m$, the output of those other AND gates $105a^1 ... 105x^1$, and $105a^m ... 105x^m$ will have to be "false"). Since $W_2L_1$ will be "true" while $W_2L_x$ will be "false" (a write enable only occurred for $L^1$), only the output of the second AND gate $110a^2$ associated with the first memory location will be "true". Thus, the $S_2L_1$ signal will be "true", which will present a "true" to the "set" input on tag register $100a^2$. At the same time, since $S_1L_1$ and $S_mL_1$ signals will be "false", the first OR gate $105a^2$ will present a "false" to the RESET input on tag register $100a^2$.

Thus, the $TAG_{W2-R1-L1}$, $TAG_{W2-R2-L1}$ ... $TAG_{W2-Rn-L1}$ inputs respectively to third AND gates $120_{W2-R1-L1}$, $120_{W2-R2-L1}$ ... $120_{W2-Rn-L1}$ respectively will be "true". When and if a read enable for memory location one ($R_1L_1, R_2L_1 ... R_nL_1$) occurs, it will be input to the third AND gate $120_{W2-R1-L1}$, $120_{W2-R2-L1}$ ... $120_{W2-Rn-L1}$ associated with the $TAG_{W2-R1-L1}$, $TAG_{W2-R2-L1}$ ... $TAG_{W2-Rn-L1}$ inputs, which will then present a "true" to the second OR gate $125_{W2-R1}$, $125_{W2-R2}$ ... $125_{W2-Rn}$ which will create "true" outputs. These outputs, designated as $Tag_{W2R1}$, $Tag_{W2R2}$ ... $Tag_{W2Rn}$ will be input to drivers $60_{W2\_R1}$, $60_{W2R2}$ ... $60_{W2Rn}$ to output the logical "one" from the memory location one within the second write-port memory array 54b. Since the drivers $60_{W1\_R1}$ and $60_{Wm\_R1}$ within read port one 56a, drivers $60_{W1\_R2}$ and $60_{Wm\_R2}$ and drivers $60_{W1\_Rn}$ and $60_{Wm\_Rn}$ will be disabled by the tag registers, only the data stored within read-port memory arrays $52a^1$, $52b^1$ ... $52n^1$, which is the last written data, will be read through read ports 56a, 56b ... 56n.

Since the first memory location $L_1$ within the second write-port memory array 54b has been tagged as "true", it is important that the $Tag_{W1R1}$, $Tag_{W1R2}$ ... $Tag_{W1Rn}$ signals that were set to "true" be reset to a "false". This in fact occurs because the write enable $W_1$ input to the first AND gates $105a^1$ associated with the first memory location $L_1$ of the first write-port memory array 54a went to "false" when the write enable $W_2$ went "true". Hence, a "false" is presented to the second AND gate $110a^1$ which then presents "false" to the SET input on tag register $100a^1$. Furthermore, since $S_2L_1$ is now a "true", the first OR gate $115a^1$ will present a "true" to the RESET input of tag register $100a^1$. Thus, $TAG_{W1\_R1\_L1}$, $TAG_{W1\_R2\_L1}$ ... $TAG_{W1\_Rn\_L1}$ will be a "false". Thus a "false" will be presented to third AND gates $120_{W1\_R1\_L1}$, $120_{W1\_R2\_L1}$ ... $120_{W1\_Rn\_L1}$, which will present a "false" to second OR gates $125_{W1\_R1}$, $125_{W1\_R2}$ ... $125_{W1\_Rn}$. This will cause $Tag_{W1R1}$, $Tag_{W1R2}$ ... $Tag_{W1\_Rn}$ to be "false", which will disable the drivers $60_{W1R1}$, $60_{W1R2}$ ... $60_{W1\_Rn}$. Therefore, the data stored in the first memory location in the read-port memory arrays 52a, 52b ... 52 of first write-port memory array 54a will not be read.

Figure 6A:
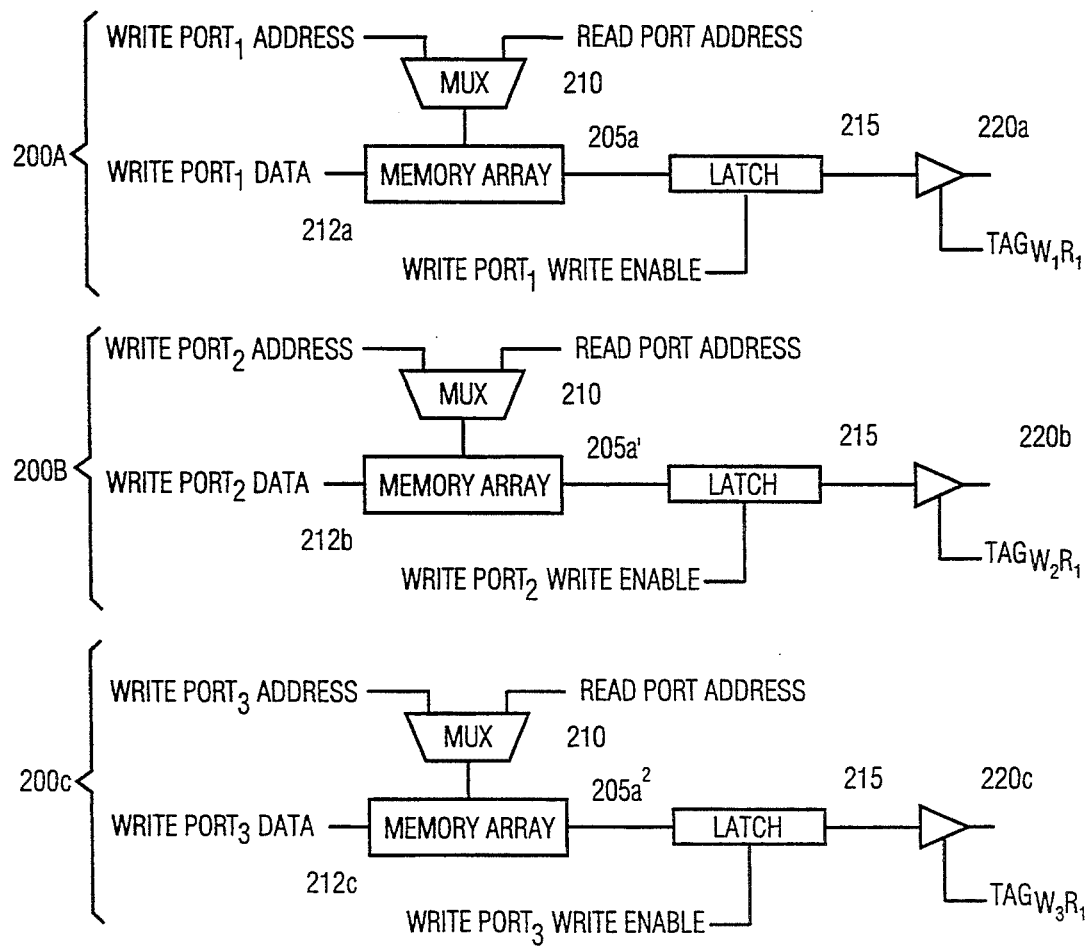
FIG. 6a and 6b is a block diagram of an example of an implementation of a multi-port memory circuit using the concepts of the present invention.
Figure 6B:
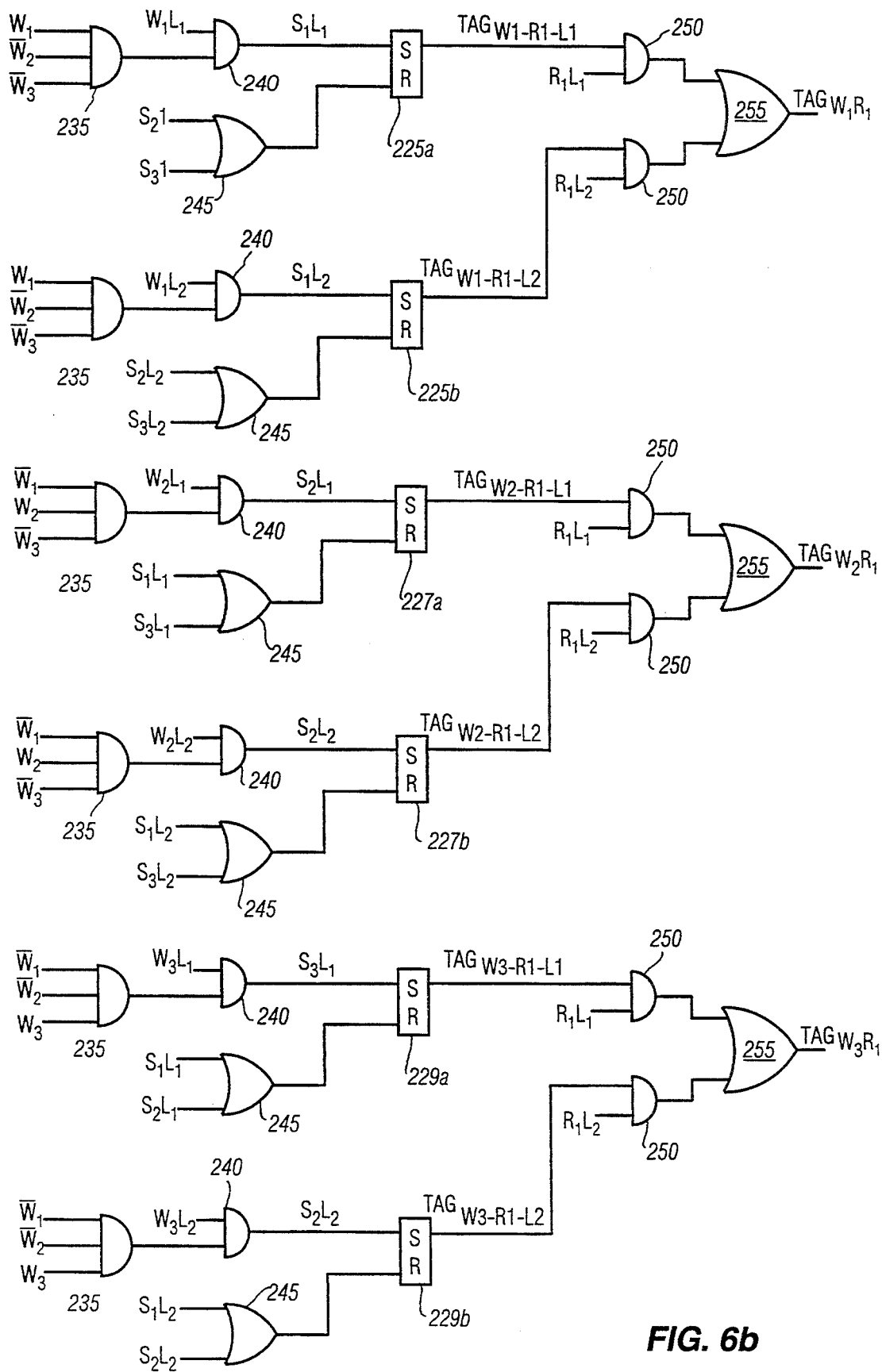

The use of tag registers is can be understood with reference to an example. FIGS. 6a and 6b show a two-by-one RAM with three write ports and one read port. In order to emulate this memory circuit, duplicate read-port memory arrays 205a, $205a^1$, $205a^2$ are formed. Each of these read-port memory arrays 205a, $205a^1$, $205a^2$ is a two-by-one memory circuit. Read-port memory array 205a is located within first write-port memory array 200a. Read-port memory array $205a^1$ is located within second write-port memory array 200b. Finally, Read-port memory array $205a^2$ is located within third write-port memory array 200c.

For each write-port memory array 200a, 200b, 200c, a multiplexer 210 with write port address and read port address inputs is input to its read-port memory array 205a, $205a^1$, $205a^2$ respectively. Hence, the read-port memory array 205a within write-port memory array 200a has a multiplexer 210 with write port$_1$-address and read port-address inputs in electrical communication thereto. Write port$_1$-data is input directly to the proper memory location within read-port memory array 205a. Read-port memory array $205a^1$ within write-port memory array 200b has a multiplexer 210 with write port$_2$-address and read port-address inputs in electrical communication thereto. Write port$_2$-data is input directly to the proper memory location within read-port memory array $205a^1$. Read-port memory array $205a^2$ within write-port memory array 200c has a multiplexer 210 with write port$_3$-address and read port-address inputs in electrical communication thereto. Write port$_3$-data is input directly to the proper memory location within read-port memory array $205a^2$.

Read-port memory array 205a is connected to a latch 215, which is then connected to driver 220a, read-port memory array $205a^1$ is connected to a latch 215, which is then connected to driver 220b and read-port memory array $205a^2$ is connected to a latch 215, which is then connected to driver 220c.

As discussed above, the number of tag registers required for a particular design is determined by the number of write ports multiplied by the number of memory locations. In the example of FIGS. 6a and 6b, since there are three write ports and two memory locations, six tag registers 225a, 225b, 227a, 227b, 229a and 229b are necessary. Tag registers 225a, 227a and 229a ensure that the last written data to memory location one ($L_1$) is read through each read port. Tag registers 225b, 227b and 229b ensure that the last written data to memory location two ($L_2$) is read through each read port. Each tag register 225a, 225b, 227a, 227b, 229a and 229b in this example is a set-reset type flip-flop.

The input logic to each tag register 225a, 225b, 227a, 227b, 229a and 229b is as follows. An output from a first AND gate 235 having inputs for each write enable, which in this example is write enable one ($W_1$), write enable two ($W_2$) and write enable three ($W_3$), is input to a second AND gate 240. The second input to the second AND gate 240 is the write enable for the particular location within that write-port memory array, for example $W_1L_1$, which is the write enable for the first memory location. The output of the second AND gate 240 is the SET for that particular memory location, which as discussed above is labeled with the convention $S_mL_x$ where m is the particular write port and x is the particular memory location. This $S_mL_x$ signal is input to the SET input of the tag registers 225a, 225b, 227a, 227b, 229a and 229b.

The tag registers are arranged by the particular write-port memory array that they are associated with. The $W_1$, $W_2$ and $W_3$ inputs to the first AND gate 235 are such that only the input for the particular write port that that tag register is associated with is "true". In this example, only the $W_1$ input for the tag registers 225a and 225b associated with the first write-port memory array 200a will be "true". Only the $W_2$ input for tag registers 227a, 227b associated with the second write-port memory array 200b will be "true". Finally, only the $W_3$ input for tag registers 229a, 229b associated with the third write-port memory array 200c will be "true".

The output of first OR gate 245 is input the RESET input of the tag registers 225a, 225b, 227a, 227b, 229a and 229b. The inputs to the first OR gate 245 are the SET $S_mL_x$ signals input to the tag registers associated with the same memory location for the other ports.

The outputs of the tag registers 225a, 225b, 227a, 227b, 229a and 229b, $TAG_{Wn\_Rm\_Lx}$, are connected to an input of a third AND gate 250. Because there is only a single read port in this example, there will only be a single output from the tag registers. The other input to the third AND gate is the read enable for that memory location associated with the $TAG_{Wn\_Rm\_Lx}$. In this example, output from tag register 225a is denoted as $TAG_{W1\_R1\_L1}$ because it will tag the first memory location within the first read-port memory array within the first write-port memory array. $TAG_{W1\_R1\_L1}$ is input to the third AND gate 250. In addition, the read enable for the first memory location is input the third AND gate 250.

There will be a third AND gate 250 for each tag register 225a, 225b, 227a, 227b, 229a and 229b. The outputs of each of the third AND gates 250 associated with a particular write-port memory array will be input to a particular second OR gate 255. The output of the second OR gates will be the signal input to the various drivers 220a, 220b, 220c.

The tag registers 225a, 225b, 227a, 227b, 229a and 229b ensure that only the last written data for a particular location is read from the selected read port. For example, if a write enable occurs at write port one 200a ($W_1$) to write a logical "one" at memory location two ($L_2$), the emulation system of the present invention would write a logical "one" in each $L_2$ located in each read-port memory array 205a, 205b and 205c. During the time the write operation is occurring, the read outputs are latched by latch 215 to ensure that the read data is not written through in the case where a read enable and a write enable occur at the same time.

At the same time the data is being written to the read-port memory arrays, the write enable signal is sent to the tag registers for the particular memory location. This write enable signal $W_1$ will be input through the first AND gate 235 associated with the tag registers 225a and 225b for the first and second memory locations within the first write-port memory array. Since $W_1$ will be "true" and $W_2$ and $W_3$ will be inverted from "false" to "true", the output of the first AND gates associated with the first write-port memory array 200a will be a "true" (note that the $W_1$ signal will also be input to all the other first AND gates 235, but since the inverse will be input to those first AND gates 235, the output of the other AND gates will have to be "false"). However, since $W_1L_1$ will be "false" while $W_{1L2}$ will be "true", only the output of the second AND gate 240 associated with the second memory location will be "true". Thus, the $S_1L_2$ signal will be "true", which will present a "true" to the "set" input on tag register 225b. At the same time, since $S_2L_2$ and $S_3L_2$ signals will be "false", the first OR gate will present a "false" to the RESET input on tag register 225b.

Thus, the $TAG_{W1\_R1\_L2}$ input to third AND gate 250 will be "true". When and if a read enable for memory location two ($R_1L_2$) occurs, it will be input to the third AND gate 250 associated with the $TAG_{W1\_R1\_L2}$ input, which will then present a "true" to the second OR gate 255, which will create a "true" output. This output, designated as $Tag_{W1R1}$, will be input to driver 220a to output the logical "one" from the memory location two within the first write-port memory array.

Now, if after the data was written to memory location two ($L_2$) through write port one 200a, new data, for example a logical "zero", is written to memory location two ($L_2$) through write port two 200b, the following will occur to ensure that only the last written data for $L_2$, a "zero" is read not a the data previously written at write port one, a "one".

When the write enable signal occurs at write port two 200b ($W_2$) to write a logical "zero", the emulation system of the present invention will write a logical "zero" in each memory location two $L_2$ located in the read-port memory array $205a^1$. During the time the write operation is occurring, the read outputs are latched by latch 215 to ensure that the read data is not written through in the case where a read enable and a write enable occur at the same time.

At the same time the data is being written to the read-port memory array $205a^1$, the write enable signal $W_2$ is sent to the tag registers for the particular memory location. This write enable signal $W_2$ will be input through the first AND gate 235 associated with the tag registers 227a and 227b for the first and second memory locations within the second write-port memory array. Since $W_2$ will be "true" and $W_1$ and $W_3$ will be inverted from "false" to "true", the output of the first AND gates associated with the second write-port memory array 200b will be a "true" (note that the "true" $W_2$ signal will also be input to all the other first AND gates 235, but since the inverse will be input to those AND gates 235, the output of the other AND gates will have to be "false"). However, since $W_2L_1$ will be "false" while $W_2L_2$ will be "true", only the output of the second AND gate 240 associated with the second memory location will be "true". Thus, the $S_2L_2$ signal will be "true", which will present a "true" to the "set" input on tag register 227b. At the same time, since $S_1L_2$ and $S_3L_2$ signals will be "false", the first OR gate will present a "false" to the RESET input on tag register 225b.

Thus, the $TAG_{W2\_R1\_L2}$ input to third AND gate 250 will be "true". When and if a read enable for memory location two ($R_1L_2$) occurs, it will be input to the third AND gate 250 associated with the $TAG_{W2\_R1\_L2}$ input, which will then present a "true" to the second OR gate 255, which will create a "true" output. This output, designated as $Tag_{W2R1}$ will be input to driver 220b to output the logical "one" from the memory location two within the first write-port memory array.

Since the second memory location $L_2$ within the second write-port memory array 205b has been tagged as "true", it is important that the $Tag_{W1R1}$ signal that was set to "true" be reset to a "false". This in fact occurs because the write enable $W_1$ input to the first AND gate associated with the first write-port memory array 205a went to "false" when the write enable $W_2$ went "true". Hence, a "false" is presented to the second AND gate, 240, which then presents "false" to the SET input on tag register 225a. Furthermore, since $S_2L_2$ is now a "true", the first OR gate 245 will present a "true" to the RESET input of tag register 225b. Thus, $TAG_{W1\_R1\_L2}$ will be a "false" Thus a "false" will be presented to third AND gate 250, which will present a "false" to second OR gate 255. This will cause $Tag_{W1R1}$ to be a "false". Therefore, the second memory location in the first write-port memory array 205a will not be read.

Thus, a preferred method and apparatus of emulating multi-port memories has been described. While embodiments and applications of this invention have been shown and described, as would be apparent to those skilled in the art, many more embodiments and applications are possible without departing from the inventive concepts disclosed herein. The invention, therefore is not to be restricted except in the spirit of the appended claims.

I claim:

1. A method of implementing a multi-port memory circuit in programmable logic devices having memory resources and logic resources, the multi-port memory circuit comprising memory locations for storing data, read ports for reading data from the memory locations and write ports for writing data to the memory locations, the method comprising the steps of:
   implementing the memory locations in the memory resources of the programmable logic devices to define a read-port memory array;
   duplicating said read-port memory array in the memory resources of the programmable logic devices for each of the read ports of the multi-port memory circuit, thereby defining a write-port memory array, the write port memory array comprising a number of read-port memory arrays being equal to the number of read ports of the multi-port memory circuit;

duplicating said write-port memory array in the memory resources of the programmable logic devices for each of the write ports of the multi-port memory circuit; and implementing a TAG array in the logic resources of the programmable logic devices, the TAG array comprising a register for each of the memory locations located within each write-port memory array, the register storing data indicative of whether the memory location corresponding to that register "last written" data therein.

2. A method of emulating a multi-port memory circuit, using the memory resources present in a group of programmable logic devices, the multi-port memory circuit having X memory locations for storing data, Y read ports for reading data from the X memory locations and Z write ports for writing data from the X memory locations, said method comprising the steps of:

generating a netlist definition of a read-port memory array with X memory locations capable of implementation in the memory resources of the programmable logic devices;

duplicating said netlist definition of said read-port memory array Y times to generate a netlist definition of a write-port memory array;

duplicating said netlist definition of said write-port memory array Z times;

programming the memory resources of the programmable logic devices to implement said Z write-port memory arrays, each of said Z write-port memory arrays having Y read-port memory arrays, each of said Y read-port memory arrays having X memory locations;

writing to a selected one of said X memory locations in each of said Y read-port memory arrays located within a selected one of said Z write-port memory arrays; and tagging as "last written" said selected one of said X memory locations in each of said Y read-port memory arrays located within said selected one of said Z write-port memory arrays.

3. A method for emulating a multi-port memory circuit as set forth in claim 2, said method further including the steps of:

placing the output of each of said read-port memory arrays in electrical communication with a respective corresponding multiplexer; and tagging the memory location of each of said read-port memory arrays located within one of said write-port memory arrays as "last written" when data is written to that memory location.

4. The method of claim 3 wherein the programmable logic devices include configurable logic blocks and wherein said tagging step further includes the steps of:

implementing a tag register for each duplicated memory location located within each write-port memory array, the tag registers being implemented in the configurable logic blocks of the programmable logic devices, said tag registers having a set input, a reset input and an output; and placing said output of each of said tag registers in electrical communication with a select input on each of said multiplexers so that said multiplexer can connect the memory location which is "last written" to the read-port of the multi-port memory circuit.

5. A method of emulating an integrated circuit in a plurality of reprogrammable logic circuits, the reprogrammable logic circuits including memory resources, the integrated circuit including a memory circuit having X memory locations for storing data, Y read ports for reading data from the X memory locations and Z write ports for writing data to the X memory locations, the method comprising the steps of:

generating a netlist description of a read-port memory array with X memory locations capable of implementation in the memory resources of the programmable logic devices;

duplicating said read-port memory array Y times in said netlist description to define a write-port memory array;

duplicating said write-port memory array Z times in said netlist description; and defining a TAG array for storing which of said Z write-port memory arrays contain data which is "last written", said TAG array comprising X*Z tag registers.

* * * * *